United States Patent
Jaiswal et al.

(10) Patent No.: US 6,734,076 B1
(45) Date of Patent: May 11, 2004

(54) METHOD FOR THIN FILM RESISTOR INTEGRATION IN DUAL DAMASCENE STRUCTURE

(75) Inventors: Rajneesh Jaiswal, Tucson, AZ (US); Eric W. Beach, Tucson, AZ (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/390,054

(22) Filed: Mar. 17, 2003

(51) Int. Cl.$^7$ ................................................ H01L 21/20
(52) U.S. Cl. ...................... 438/384; 438/381; 438/383; 438/638
(58) Field of Search ................ 438/238, 381, 438/382, 383, 384, 638, FOR 220

(56) References Cited

U.S. PATENT DOCUMENTS

| | | | | |
|---|---|---|---|---|
| 3,988,824 A | * | 11/1976 | Bodway | 216/16 |
| 5,976,943 A | * | 11/1999 | Manley et al. | 438/382 |
| 6,110,772 A | * | 8/2000 | Takada et al. | 438/238 |
| 6,323,096 B1 | * | 11/2001 | Saia et al. | 438/384 |
| 6,500,724 B1 | * | 12/2002 | Zurcher et al. | 438/384 |
| 6,534,374 B2 | * | 3/2003 | Johnson et al. | 438/381 |
| 6,610,569 B1 | * | 8/2003 | Shimamoto et al. | 438/257 |
| 2002/0132442 A1 | * | 9/2002 | Roy et al. | 438/382 |

* cited by examiner

*Primary Examiner*—Fernando L. Toledo
(74) *Attorney, Agent, or Firm*—Peter K. McLarty; W. James Brady, III; Frederick J. Telecky, Jr.

(57) ABSTRACT

A thin film resistor (55) is formed over an etch stop layer 40. Contact pads (65) are formed n the thin film resistor (55) and a dielectric layer (80) is formed over the thin film resistor (55). Metal structures (120 are formed above the thin film resistor (55) and metal (110) is used to fill a trench and via formed in the dielectric layer (80).

13 Claims, 4 Drawing Sheets

METHOD FOR THIN FILM RESISTOR INTEGRATION IN DUAL DAMASCENE STRUCTURE

FIELD OF THE INVENTION

The invention is generally related to the field of thin film resistors and more specifically to a method of forming a thin film resistor in a dual damascene structure with copper interconnects.

BACKGROUND OF THE INVENTION

Thin film resistors are very attractive components for high precision analog and mixed signal applications. In addition to a low thermal coefficient of resistance, low voltage coefficient of resistance, and good resistor matching they should provide good stability under stress.

High frequency mixed signal applications require the use of copper interconnects. Integrated circuit copper interconnects are formed using damascene processes. In a damascene process a trench is first formed in a dielectric layer. The trench is then filled with copper and the excess copper is removed by a number of methods including chemical mechanical polishing.

The formation of thin film resistors in an integrated circuit containing copper interconnects presents many challenges. The thin film resistor is not formed using copper and so is incompatible with existing damascene processes. The incompatibility is exacerbated by the requirement that the thin film resistors be formed in the same levels as the copper interconnects. There is therefore a need for a method to form thin film resistors in integrated circuits with copper interconnects formed using damascene processes.

SUMMARY OF THE INVENTION

The instant invention describes a method for integrating a thin film resistor into an integrated circuit comprising copper interconnects formed using dual damascene structures. In an embodiment of the instant invention an etch stop layer is formed on a dielectric layer. A thin film resistor is formed over the etch stop layer and contact pads are formed on the thin film resistor. A second dielectric layer is formed over the thin film resistor and at least one trench is formed in the second dielectric layer. At the same time thin film resistor vias are formed above the contact pads on the thin film resistor. A via trench is formed in the trench structure and metal is formed in the trench, via trench, and thin film resistor vias.

Figure 1A:
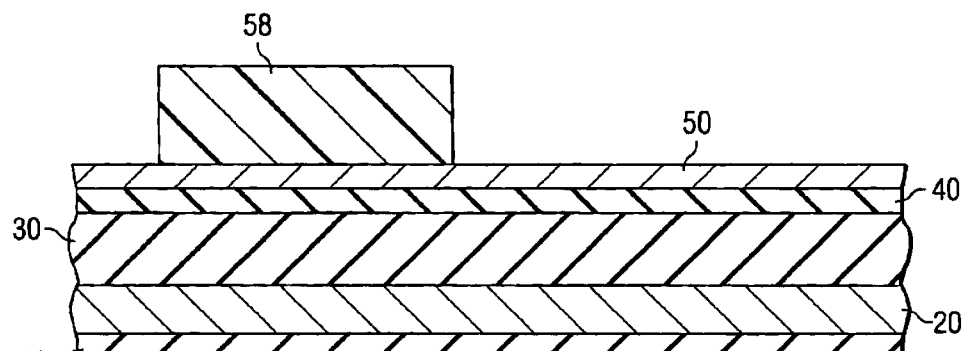
FIG. 1(a) to FIG. 1(f) are cross-section drawings illustrating an embodiment of the instant invention.

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIGS. 1–2, the instant invention can be utilized in many semiconductor device structures. The methodology of the instant invention provides a solution to forming thin film resistors in integrated circuits comprising copper interconnects.

An embodiment of the instant invention is shown in FIG. 1(a)–FIG. 1(f). As shown in FIG. 1(a) a metal interconnect 20 is formed over a dielectric layer 10. The dielectric layer 10 is formed over a semiconductor substrate and any number of intervening layers. The semiconductor and any intervening layers have been omitted from the Figures for clarity. Although omitted from the Figures, the layers beneath the dielectric layer 10 will comprise any number of active devices including MOS and/or bipolar transistors as well as any number of metal interconnect levels. As shown in FIG. 1(a) an inter-level dielectric layer 30 is formed over the metal interconnect layer 20. The inter-level dielectric layer 30 can comprise silicon oxide formed using any suitable method including chemical vapor deposition. In a first embodiment the inter-level dielectric layer 30 is formed using material selected from the group comprising TEOS silicon oxides, PECVD silicon oxides, silicon nitrides, silicon oxynitrides, silicon carbides, spin-on glass (SOG) such as silsesquioxanes and siloxane, xerogels or any other suitable material. Following the formation of the inter-level dielectric layer 30, an etch stop layer 40 is formed over the inter-level dielectric layer 30. In an embodiment the etch stop layer 40 can comprise silicon nitride, silicon carbide, silicon oxynitride, combinations of one or all of these and other suitable layers, and any other suitable dielectric material. A thin film resistor layer 50 is then formed over the etch stop layer 40. In subsequent processing the resistor layer 50 will be etched to form the thin film resistor (TFR). In an embodiment of the instant invention the resistor layer 50 is formed using a silicon chromium (SiCr) alloy, nickel chromium (NiCr) alloy, tantalum nitride, titanium nitride, tungsten, or any other suitable material. A photoresist layer 58 is formed and patterned over the thin film resistor layer 50 and will be used to define the TFR during the etching process.

Figure 1B:
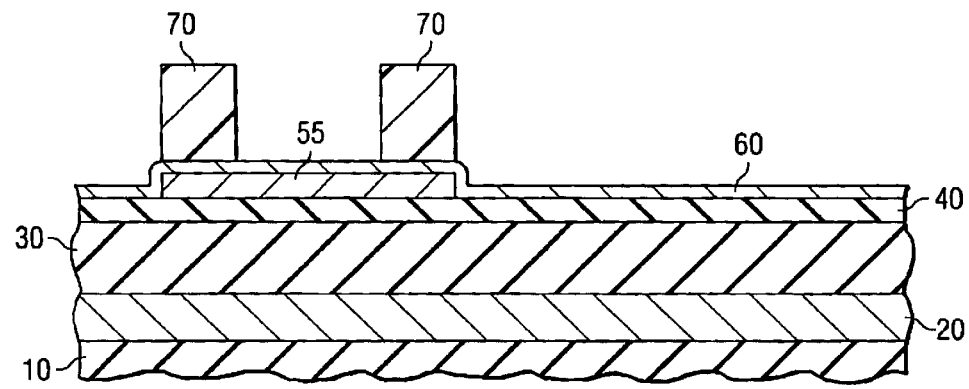

Shown in FIG. 1(b) is the TFR 55 formed by etching the resistor layer 50 using the photoresist layer 58 shown in FIG. 1(a) as a masking layer. The resistor layer 50 can be etched using any suitable dry or wet etching process. Following the formation of the TFR structure 55 a conductive contact layer 60 is formed over the TFR structure 55. In an embodiment the conductive contact layer 60 is formed using titanium nitride, titanium tungsten, or any other suitable conductive material. In further embodiments of the instant invention the conductive contact layer 60 can comprise multiple layers formed using layers comprised of the same or differing conductive material. Following the formation of the contact layer 60, patterned photoresist 70 is formed over the capping layer as shown in FIG. 1(b) and will be used to pattern the contact layer 60.

Figure 1C:
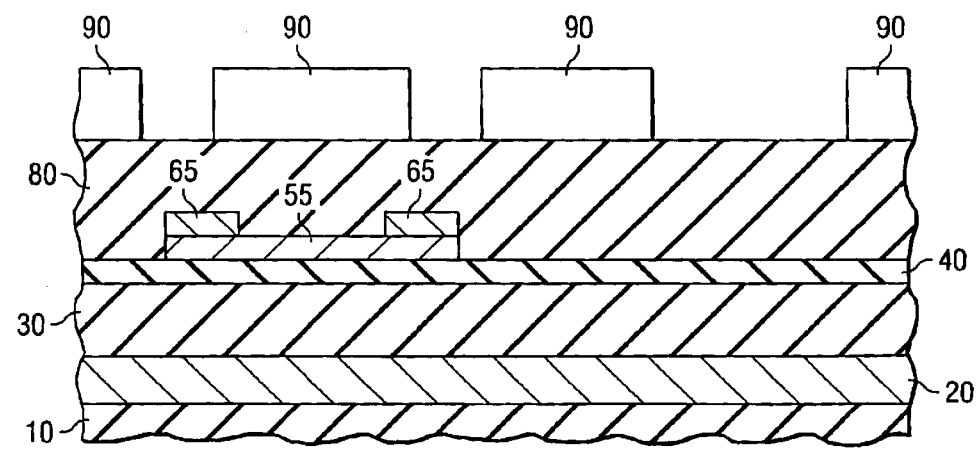

Following the etching of the contact layer 60 shown in FIG. 1(b), contact pads 65 are formed as shown in FIG. 1(c). The contact pads 65 will protect the TFR 55 during the subsequent trench etch etch. Following the formation of the contact pads 65, an inter-level dielectric layer 80 is formed over the TFR 55. The inter-level dielectric layer 80 can comprise silicon oxide formed using any suitable method including chemical vapor deposition. In an embodiment the inter-level dielectric layer 80 is formed using material selected from the group comprising TEOS silicon oxides, PECVD silicon oxides, silicon nitrides, silicon oxynitrides, silicon carbides, spin-on glass (SOG) such as silsesquioxanes and siloxane, xerogels or any other suitable material.

Following the formation of the inter-level dielectric layer 80, patterned photoresist layers 90 are formed on the inter-level dielectric layer 80. The patterned photoresist layers 90 will function as etch masks during the subsequent etching of vias and trenches in the dielectric layer 80.

Figure 1D:
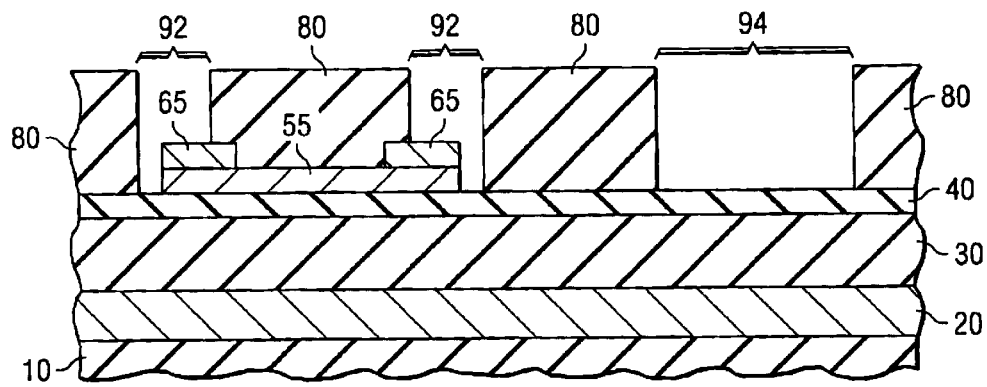
Figure 1E:
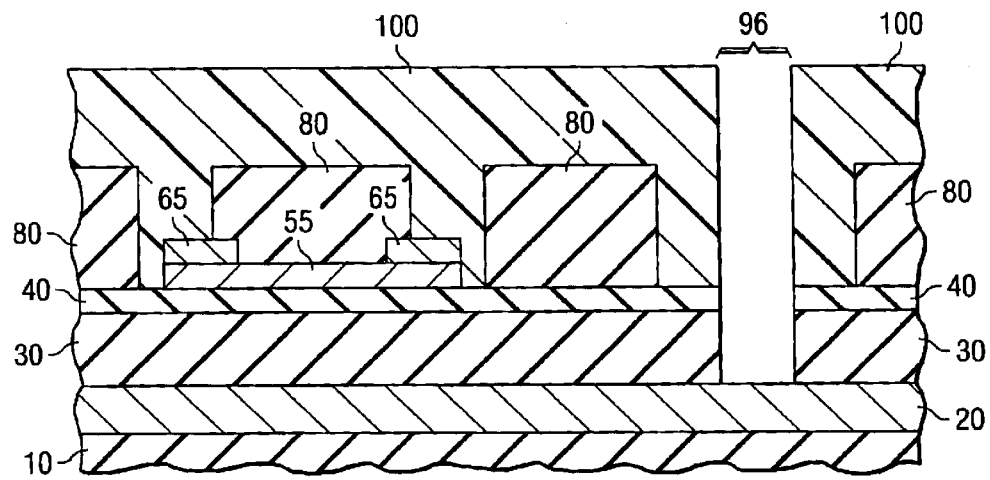

Shown in FIG. 1(d) is the structure of FIG. 1(c) following the simultaneous etching of TFR vias 92 and a trench 94 in the inter-level dielectric layer 80. Although only a single TFR and trench is shown in the Figure, it should be noted that the method of the instant invention could be used to form any number of trench and via structures in the dielectric layer in addition to the TFR vias. It should also be noted that a via will be used in the instant invention to describe a structure that contacts an underlying conductive layer such as a TFR, a metal interconnect, or an electronic device. A trench will be used to describe the structure formed in the dielectric layer in which a metal interconnect line will be formed. The etching of the inter-level dielectric layer 80 in FIG. 1(d) is performed using a dry etch process that is designed to stop on the etch stop layer 40. In the case of a silicon oxide dielectric layer 80 and a silicon nitride etch stop layer 40, any dry etch process with high silicon oxide to silicon nitride selectivity can be used. It should be noted that during the etching of the dielectric layer 80, the contact pads 65 will protect the regions of the TFR 55 that would have been exposed to the etch process. The etch process used should therefore also have high selectivity between the dielectric layer 80 and the contact pads 65. The etched TFR vias 92 will be used to provide electrical contact to the TFR 55 and a copper interconnect metal line will be formed in the trench structure 94.

Figure 1F:
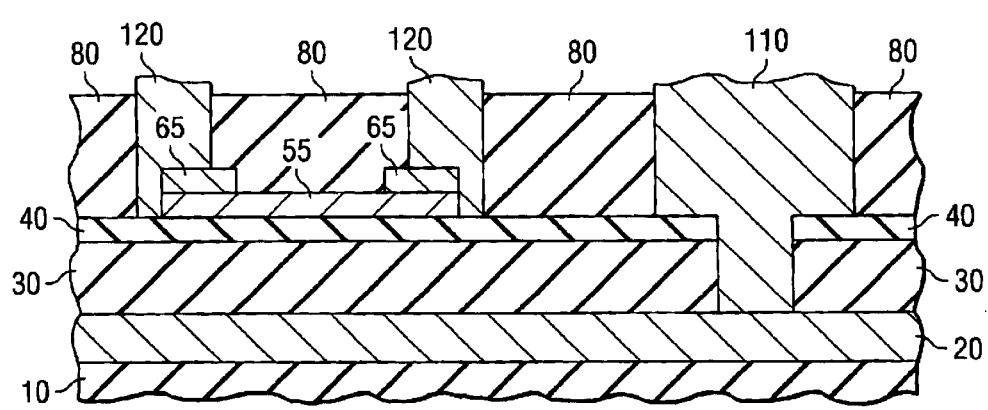

Following the formation of the trench 94 and TFR vias 92 shown in FIG. 1(d), a patterned photoresist layer 100 is formed and used as a mask during the formation of the trench via 96. The trench via 96 is formed by etching through the etch stop layer 40 and the underlying dielectric layer 30. As shown in FIG. 1(f), following the formation of the trench via 96, the photoresist layer 100 is removed and metal 120 and 110 is formed in the TFR vias and the trench and trench via respectively. In an embodiment of the instant invention the metal formed can comprise copper or any other suitable metal. For copper metal, 120 and 110 can be formed using any known integrated circuit processing method including copper metal deposition and chemical mechanical polishing. Following the formation of the structure shown in FIG. 1(f), the integrated circuit can be completed using known manufacturing methods.

Figure 2A:
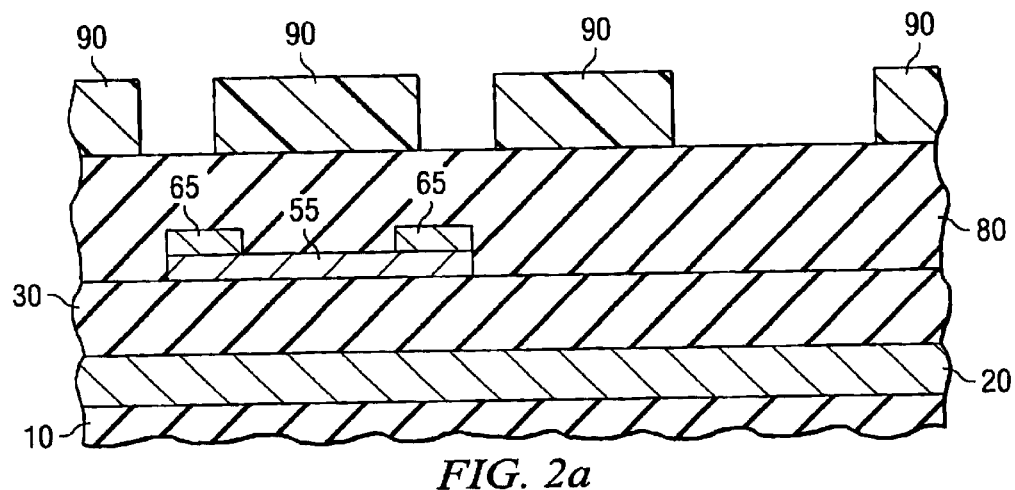
FIG. 2(a) to FIG. 2(d) are cross-sectional drawings illustrating a further embodiment of the instant invention.

A further embodiment of the instant invention is shown in FIG. 2(a)–FIG. 2(d). Shown in FIG. 2(a) is a metal interconnect 20 is formed over a dielectric layer 10. An inter-level dielectric layer 30 is formed on the metal interconnect layer 10. The inter-level dielectric layer 30 can comprise silicon oxide formed using any suitable method including chemical vapor deposition. In a first embodiment the inter-level dielectric layer 30 is formed using material selected from the group comprising TEOS silicon oxides, PECVD silicon oxides, silicon nitrides, silicon oxynitrides, silicon carbides, spin-on glass (SOC) such as silsesquioxanes and siloxane, xerogels or any other suitable material. Following the formation of the inter-level dielectric layer 30, a thin film resistor 55 and contact pads 65 are formed as described above. In an embodiment of the instant invention the resistor layer is formed using a silicon chromium (SiCr) alloy, nickel chromium (NiCr) alloy, tantalum nitride, titanium nitride, tungsten, or any other suitable material.

Following the formation of the TFR 55 and the contact pads 65, an inter-level dielectric layer 80 is formed over the TFR 55. The inter-level dielectric layer 80 can comprise silicon oxide formed using any suitable method including chemical vapor deposition. In an embodiment the inter-level dielectric layer 80 is formed using material selected from the group comprising TEOS silicon oxides, PECVD silicon oxides, silicon nitrides, silicon oxynitrides, silicon carbides, spin-on glass (SOG) such as silsesquioxanes and siloxane, xerogels or any other suitable material. Following the formation of the inter-level dielectric layer 80, patterned photoresist layers 90 are formed on the dielectric layer 80. The patterned photoresist layers 90 will function as etch masks during the subsequent etching of trenches in the dielectric layer 80.

Figure 2B:
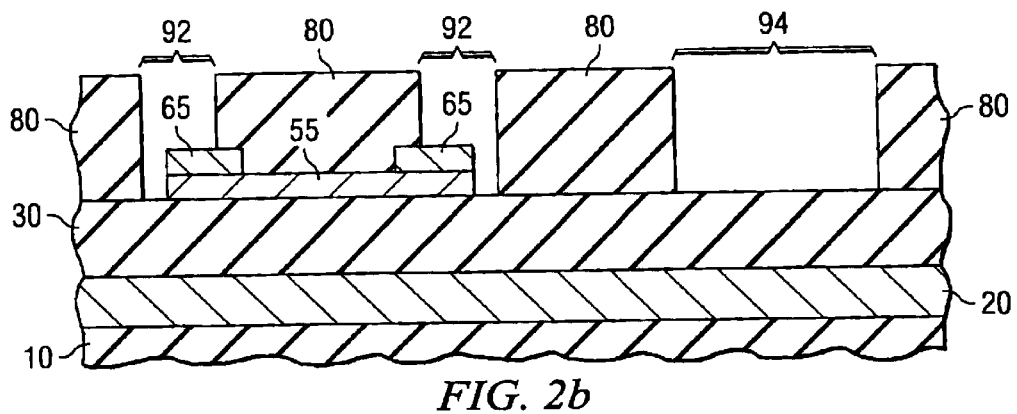
Figure 2C:
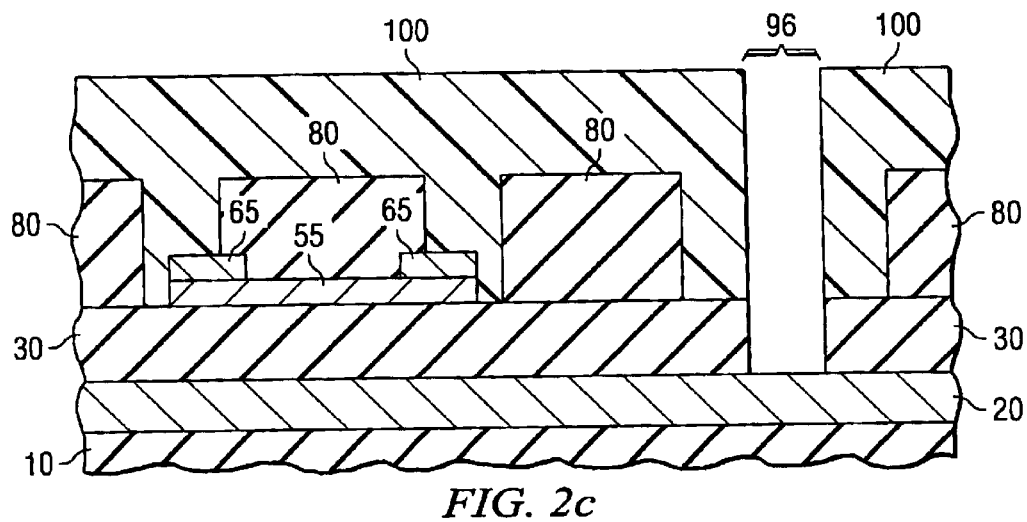

Shown in FIG. 2(b) is the structure of FIG. 2(a) following the simultaneous etching of TFR vias 92 and the trench 94 in the dielectric layer 80. The etching of the inter-level dielectric layer 80 in FIG. 2(b) is performed using a timed dry etch process that is designed to stop upon etching through the dielectric layer 80. It is not critical that the etch process stop immediately at the interface between the dielectric layers 80 and 30. It is however important that the contact pads 65 be exposed following the etch process. During the etching of the inter-level dielectric layer 80, the contact pads 65 will protect the regions of the TFR 55 that would have been exposed to the etch process. This implies that the etch process used should also have high selectivity between the dielectric layer 80 and the contact pads 65. The etched TFR vias 92 will be used to provide electrical contact to the TFR 55 and a copper interconnect will be formed in the trench structure 94.

Figure 2D:
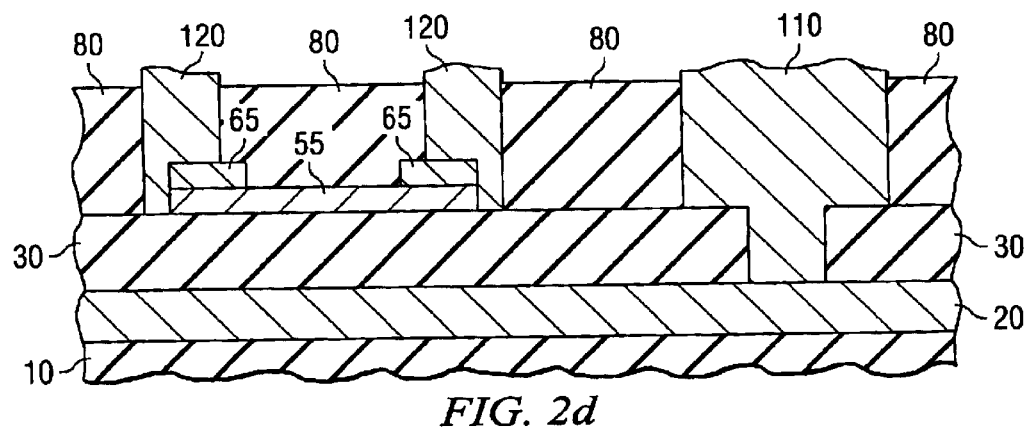

Following the formation of the trench 94 and TFR vias 92 shown in FIG. 2(b), a patterned photoresist layer 100 is formed and used as a mask during the formation of the trench via 96. The trench via 96 is formed by etching through the etch stop layer 40 and the underlying inter-level dielectric layer 30. As shown in FIG. 2(d), following the formation of the trench via 96, the photoresist layer 100 is removed and copper metal 120 and 110 is formed in the TFR vias, the trench, and the trench via. The copper metal 120 and 110 can be formed using any known integrated circuit processing method including copper metal deposition and chemical mechanical polishing. Following the formation of the structure shown in FIG. 2(d), the integrated circuit can be completed using known manufacturing methods.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for forming a integrated circuit thin film resistor, comprising:

forming a first dielectric layer over a semiconductor;

forming an etch stop layer over said dielectric layer;

forming a thin film resistor on said etch stop layer;

forming a second dielectric layer over said thin film resistor;

simultaneously forming at least one trench and thin film resistor vias in said second dielectric layer;

forming a trench via in said at least one trench; and filling said thin film resistor vias, said trench and said trench via with a metal.

2. The method of claim 1 wherein said second dielectric layer comprises a material selected from the group consisting of TEOS silicon oxides, PECVD silicon oxides, silsesquioxanes, siloxane, and xerogels.

3. The method of claim 2 wherein said etch stop layer comprises silicon nitride.

4. The method of claim 1 further comprising forming contact pads on said thin film resistor wherein said thin film resistor vias are positioned above said contact pads.

5. The method of claim 1 wherein said thin film resistor is formed using a material selected from the group consisting of silicon chromium (SiCr) alloy, nickel chromium (NiCr) alloy, tantalum nitride, titanium nitride, and tungsten.

6. A method for forming a thin film resistor, comprising:

forming a first dielectric layer over a semiconductor;

forming a thin film resistor over said first dielectric layer;

forming a second dielectric layer over said thin film resistor;

simultaneously forming at least one trench and thin film resistor vias in said second dielectric layer;

forming a trench via in said at least one trench; and filling said thin film resistor vias, said trench and said trench via with a metal.

7. The method of claim 6 wherein said second dielectric layer comprises a material selected from the group consisting of TEOS silicon oxides, PECVD silicon oxides, silsesquioxanes, siloxane, and xerogels.

8. The method of claim 6 further comprising forming contact pads on said thin film resistor wherein said thin film resistor vias are positioned above said contact pads.

9. The method of claim 6 wherein said thin film resistor is formed using a material selected from the group consisting of silicon chromium (SiCr) alloy, nickel chromium (NiCr) alloy, tantalum nitride, titanium nitride, and tungsten.

10. An integration method for forming a integrated circuit thin film resistor, comprising:

forming a first dielectric layer over a semiconductor;

forming an etch stop layer over said dielectric layer;

forming a thin film resistor on said etch stop layer;

forming contact pads on said thin film resistor;

forming a second dielectric layer over said thin film resistor and said contact pads;

simultaneously forming at least one trench and thin film resistor vias in said second dielectric layer wherein said thin film resistor vias are positioned above said contact pads;

forming a trench via in said at least one trench; and filling said thin film resistor vias, said trench and said trench via with a metal.

11. The method of claim 10 wherein said second dielectric layer comprises a material selected from the group consisting of TEOS silicon oxides, PECVD silicon oxides, silsesquioxanes, siloxane, and xerogels.

12. The method of claim 10 wherein said etch stop layer comprises silicon nitride.

13. The method of claim 1 wherein said thin film resistor is formed using a material selected from the group consisting of silicon chromium (SiCr) alloy, nickel chromium (NiCr) alloy, tantalum nitride, titanium nitride, and tungsten.

* * * * *